United States Patent
Kumagawa et al.

(10) Patent No.: US 9,479,127 B2
(45) Date of Patent: Oct. 25, 2016

(54) POWER AMPLIFICATION APPARATUS AND CONTROL METHOD

(71) Applicant: Panasonic Corporation, Osaka (JP)

(72) Inventors: Masahiro Kumagawa, Hyogo (JP); Hisashi Adachi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/626,714

(22) Filed: Feb. 19, 2015

(65) Prior Publication Data
US 2015/0249431 A1 Sep. 3, 2015

(30) Foreign Application Priority Data
Feb. 28, 2014 (JP) .................. 2014-038864

(51) Int. Cl.
H03F 3/217 (2006.01)
H03F 3/00 (2006.01)
H03F 1/02 (2006.01)
H03F 1/32 (2006.01)
H03F 3/24 (2006.01)

(52) U.S. Cl.
CPC ............ *H03F 3/005* (2013.01); *H03F 1/0277* (2013.01); *H03F 1/3205* (2013.01); *H03F 3/2178* (2013.01); *H03F 3/245* (2013.01); *H03F 3/217* (2013.01); *H03F 2200/231* (2013.01); *H03F 2200/432* (2013.01)

(58) Field of Classification Search
CPC .... H03F 1/0205; H03F 3/2178; H03F 3/005; H03F 2203/21196; H03F 2200/231; H03F 3/245; H03F 1/0277; H03F 1/3205; H03F 1/02; H03F 3/00

USPC ....................... 330/10, 207 A, 251
See application file for complete search history.

(56) References Cited

U.S. PATENT DOCUMENTS

| | | | | |
|---|---|---|---|---|
| 7,786,795 | B2* | 8/2010 | Shimizu | H03F 3/217 330/10 |
| 8,115,540 | B2* | 2/2012 | Nose | H03F 1/32 330/251 |
| 2003/0038674 | A1* | 2/2003 | Masuda | H03F 3/2171 330/10 |
| 2010/0109773 | A1* | 5/2010 | Takagi | H03F 3/217 330/251 |

FOREIGN PATENT DOCUMENTS

JP 2008-172511 7/2008

OTHER PUBLICATIONS

Sang-Min Yoo, et al. "A Switched-Capacitor RF Power Amplifier" IEEE Journal of Solid-State Circuits, vol. 46, No. 12, Dec. 2011, pp. 2977-2987.

* cited by examiner

*Primary Examiner* — Khanh V Nguyen
(74) *Attorney, Agent, or Firm* — Greenblum & Bernstein, P.L.C.

(57) ABSTRACT

A power amplification apparatus generates a code for controlling the number of class D power amplifiers that are in operation among a plurality of class D power amplifiers, changes the duty ratio of a carrier wave signal in accordance with output voltage, and amplifies a transmission signal. A code for decreasing the number of class D power amplifiers in operation is generated when the duty ratio of the carrier wave signal is increased, while a code for increasing the number of class D power amplifiers in operation is generated when the duty ratio of the carrier wave signal is decreased.

4 Claims, 9 Drawing Sheets

FIG. 4

| OUTPUT VOLTAGE SETTING SIGNAL | AM CODE | DUTY |
|---|---|---|
| $V_1$ | 1 | $D_\alpha$ |
| $V_2$ | 2 | |
| ⋮ | ⋮ | |
| $V_{20}$ | 20 | |
| $V_{21}$ | 17 | $D_\beta$ |
| $V_{22}$ | 18 | |
| ⋮ | ⋮ | |
| $V_{30}$ | 26 | |
| $V_{31}$ | 24 | $D_\gamma$ |
| $V_{32}$ | 25 | |
| ⋮ | ⋮ | |
| $V_{40}$ | 33 | |

POWER AMPLIFICATION APPARATUS AND CONTROL METHOD

CROSS REFERENCES TO RELATED APPLICATIONS

This application claims priority to Japanese Patent Applications No. 2014-038864, filed on Feb. 28, 2014, the contents of (each of) which are hereby incorporated by reference.

BACKGROUND

1. Technical Field

The present disclosure relates to a power amplification apparatus and a control method for amplifying a transmission signal using multiple class D power amplifiers.

2. Description of the Related Art

A power amplification apparatus incorporated into a transmitter used for wireless communication typically increases the small amplitude of an input signal in order to gain a signal output strength necessary for a radio system and outputs the amplified signal. For amplifying the small amplitude of the input signal to obtain a signal of high output power, the power amplification apparatus consumes much power. Power consumption largely affects the operating time of a radio which is powered by a battery, such as a cellular phone. The power amplification apparatus is accordingly required to have high power efficiency.

One possible means to increase the power efficiency is use of a class D power amplifier. The class D power amplifier is an amplifier that makes use of the saturated operation of transistors and can achieve high power efficiency because, ideally, a current flows during a switching period and no unnecessary current flows.

For a modulation scheme, orthogonal frequency-division multiplexing (hereinafter denoted as OFDM), used in wireless LANs, has been employed in recent years in order to improve spectrum efficiency. The OFDM scheme modulates and multiplexes multiple carrier waves that have different frequencies and are orthogonal to each other. The OFDM scheme has a high power peak relative to the average power at a timing when the phases of the carrier waves overlap. The ratio of the average power to the peak power is represented by peak average power ratio (hereinafter denoted as PAPR), which is about 10 dB in the OFDM scheme, for example. The OFDM scheme inherently has a high PAPR and requires a linear amplifier for suppressing the effect of intersymbolic interference caused by distortion, for example. When the peak power is the saturation power of the power amplifier, the average power assumes a small value relative to the saturation power. In such a situation, the power efficiency at the time of output of the average power is low because the power amplifier cannot be operated at an operating point of high power efficiency. Here, the difference between the maximum power and the average power is called the amount of backoff. As the amount of backoff increases, the power amplifier operates at an operating point with a lower power efficiency.

A switched-capacitor power amplifier is a possible means to improve the power efficiency. A switched-capacitor power amplifier can control the output voltage so as to be linear by preparing multiple small-sized amplifier cells and controlling the number of active amplifier cells with a digital code. An example of the switched-capacitor power amplifier is described in A Switched-Capacitor RF Power Amplifier Solid-State Circuits, IEEE Journal of Volume: 46, Issue: 12 pp. 2977-2987, December 2011. A switched-capacitor power amplifier can be considered as a radio frequency-digital analog converter (RF-DAC) that outputs a high frequency signal having an amplitude controlled by a digital code, improvement of the linearity being the issue to be dealt with. In the description that follows, such a digital code for controlling the amplitude will be referred to as AM code.

A switched-capacitor power amplifier controls the gate voltages of an Nch transistor and a Pch transistor with a carrier wave signal so that the Nch transistor and the Pch transistor alternately turn on to amplify the amplitude of the input signal. In the process, the waveform of the carrier wave signal used for controlling the gate voltages can become rounded (deformed) due to the effect of parasitic resistance or parasitic capacitance of wiring. The Nch transistor and the Pch transistor then would turn on and an unnecessary through current would flow from the Pch transistor to the Nch transistor, causing a reduction in power efficiency. In a conventional practice, this is addressed by changing the duty ratio of the carrier wave signal so as to prevent both the Nch transistor and Pch transistor from turning on at same period due to rounding (deformation) of the waveform of the carrier wave signal.

With a traditional switched-capacitor power amplifier, when the duty ratio is varied as three different values $D_\alpha$, $D_\beta$, and $D_\gamma$ ($0 < D_\alpha < D_\beta < D_\gamma \leq 0.5$) in accordance with output voltage Vout as shown in FIG. 1 for example, a higher output voltage is produced as the AM code becomes larger. In FIG. 2, periods in which the voltage Vout is not output (the ranges ΔVa and ΔVb in FIG. 2) occur when the duty ratio is changed. Thus, a conventional switched-capacitor power amplifier causes degradation in linearity.

To overcome this problem, the technique disclosed in Japanese Unexamined Patent Application Publication No. 2008-172511 improves the linearity by compensating distortion using multiple distortion compensation tables.

SUMMARY

For compensating distortion as in the aforementioned technique, it is necessary to output an optimal value after distortion compensation. When the optimal value after distortion compensation is a voltage that is not output like ΔVa and ΔVb shown in FIG. 2, however, compensation of distortion is difficult even with distortion compensation tables.

Thus, one non-limiting and exemplary embodiment provides a power amplification apparatus and control method that can prevent occurrence of a voltage that is not output and suppress a degradation in the linearity of power amplifiers by controlling the operating status of class D power amplifiers when the duty ratio of the carrier wave signal input to the class D power amplifiers is changed.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a power amplification apparatus, including a controller that generates a code for controlling a number of class D power amplifiers that are in operation among the plurality of class D power amplifiers in accordance with an output voltage, a duty ratio converter that changes a duty ratio of a carrier wave signal in accordance with the output voltage, and an amplifier that includes the plurality of class D power amplifiers and that outputs a signal of a prescribed voltage using the class D power amplifiers that are in operation based on the generated code and the carrier wave signal having the changed duty ratio, in which the controller generates the code for decreasing the number of class D power amplifiers that are in operation when the duty ratio is increased by the duty ratio converter, and generates the code for increasing the number of class D power amplifiers that are in operation when the duty ratio is decreased by the duty ratio converter.

In another general aspect, the techniques disclosed here feature a control method for controlling a number of class D power amplifiers that are in operation among a plurality of class D power amplifiers, including: generating a code for controlling the number of class D power amplifiers that are in operation in accordance with an output voltage, and changing a duty ratio of a carrier wave signal in accordance with the output voltage, in which the code for decreasing the number of class D power amplifiers that are in operation is generated when the duty ratio is increased, and the code for increasing the number of class D power amplifiers that are in operation is generated when the duty ratio is decreased.

According to the present disclosure, by controlling the operation of class D power amplifiers when changing the duty ratio, occurrence of a voltage that is not output can be prevented and degradation in linearity of the power amplifiers can be suppressed.

These general and specific aspects may be implemented using a system, a method, and a computer program, and any combination of systems, methods, and computer programs.

BRIEF DESCRIPTION OF THE DRAWINGS

FIG. 4 shows the correspondence between the AM code, duty ratio, and setting signal in the first embodiment of the present disclosure;

DETAILED DESCRIPTION

A power amplification apparatus and a transmitter according to embodiments of the present disclosure will be described below with reference to drawings.

First Embodiment

Configuration of Power Amplification Apparatus

Figure 3:
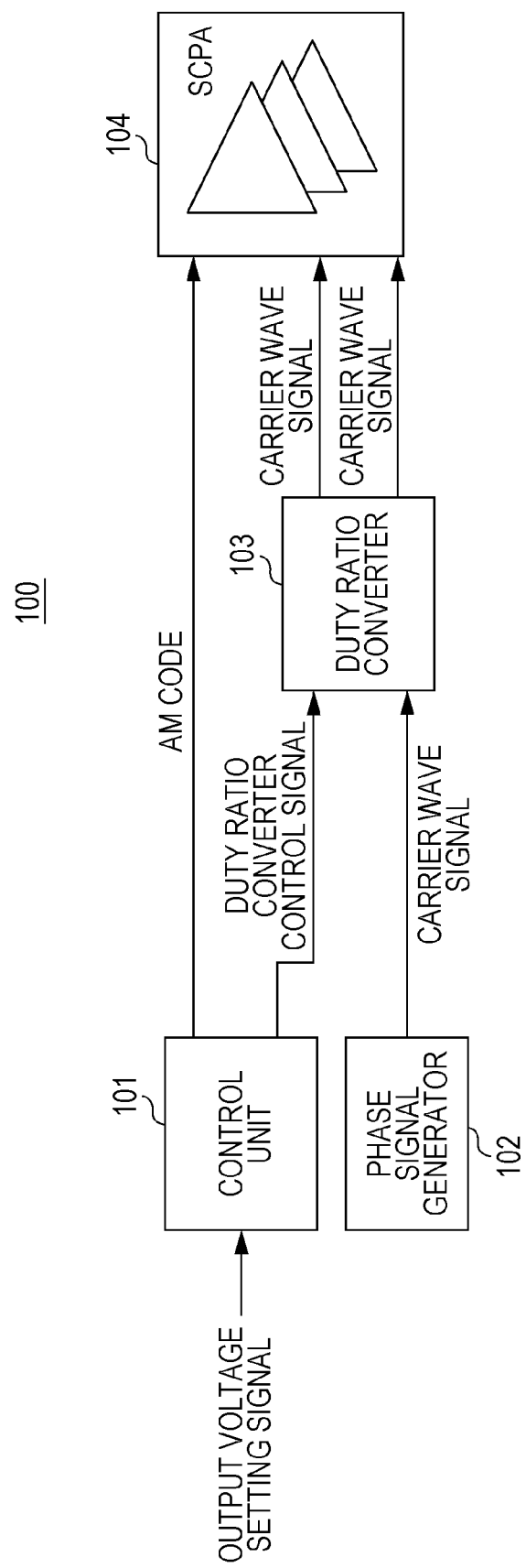
FIG. 3 shows the configuration of the power amplification apparatus according to a first embodiment of the present disclosure.

The configuration of a power amplification apparatus 100 according to a first embodiment of the present disclosure will be described with reference to FIGS. 3 and 4.

The main components of the power amplification apparatus 100 are a control unit (controller) 101, a phase signal generator 102, a duty ratio converter 103, and an amplification unit (amplifier) 104 composed of class D power amplifiers.

To the control unit 101, an output voltage setting signal (hereinafter referred to as "setting signal") indicative of a desired output voltage is input. In response to the setting signal, the control unit 101 generates an AM code for controlling the number of class D power amplifiers that are in operation, and generates a duty ratio converter control signal (hereinafter referred to as "control signal") for controlling the duty ratio in the duty ratio converter 103. The control unit 101 outputs the AM code to the amplification unit 104 and outputs the generated control signal to the duty ratio converter 103. The AM code is a digital code used for controlling the number of class D power amplifiers that are in operation.

The control unit 101 selects an AM code and duty ratio associated with the setting signal $V_1$ to $V_{40}$ input to it with reference to the correspondence shown in FIG. 4. The control unit 101 stores the correspondence shown in FIG. 4 as a table, for example. The control unit 101 generates the AM code it selected. The control unit 101 also generates the control signal for controlling the duty ratio of the carrier wave signal to the selected duty ratio in the duty ratio converter 103. The setting signal indicates a higher voltage as it increases from $V_1$ toward $V_{40}$; and the AM code indicates a larger number of class D power amplifiers to be brought into operation as it increases from 1 toward 33, where $0 < D_\alpha < D_\beta < D_\gamma \leq 0.5$.

When increasing the duty ratio from $D_\alpha$ to $D_\beta$, for example, the control unit 101 decreases the AM code by changing it from "20" to "17" with reference to the correspondence in FIG. 4. This decreases the number of class D power amplifiers in operation. When decreasing the duty ratio from $D_\beta$ to $D_\alpha$ for example, the control unit 101 increases the AM code by changing it from "17" to "20" with reference to the correspondence in FIG. 4. This increases the number of class D power amplifiers in operation. Similar operations take place when the duty ratio is increased from $D_\beta$ to $D_\gamma$ and decreased from $D_\gamma$ to $D_\beta$.

The phase signal generator 102 may include a voltage controlled oscillator or a phase locked loop (PLL), for example. The phase signal generator 102 generates a carrier wave signal having a high frequency, for example, 1 GHz, and a fixed duty ratio, and outputs it to the duty ratio converter 103.

The duty ratio converter 103 changes the duty ratio of the carrier wave signal input from the phase signal generator 102 in accordance with the control signal input from the control unit 101. The carrier wave signal having the changed duty ratio is output to the amplification unit 104. The detailed configuration of the duty ratio converter 103 will be discussed later.

The amplification unit 104 includes multiple circuits connected in parallel. Each of the circuits has a class D power amplifier that uses a MOS transistor and a capacitor connected to the output terminal of the class D power amplifier. The amplification unit 104 outputs a signal of a prescribed voltage on the basis of the AM code input from the control unit 101 and the carrier wave signal input from the duty ratio converter 103. The detailed configuration of the amplification unit 104 will be discussed later.

<Configuration and Operation of the Duty Ratio Converter>

Figure 5:
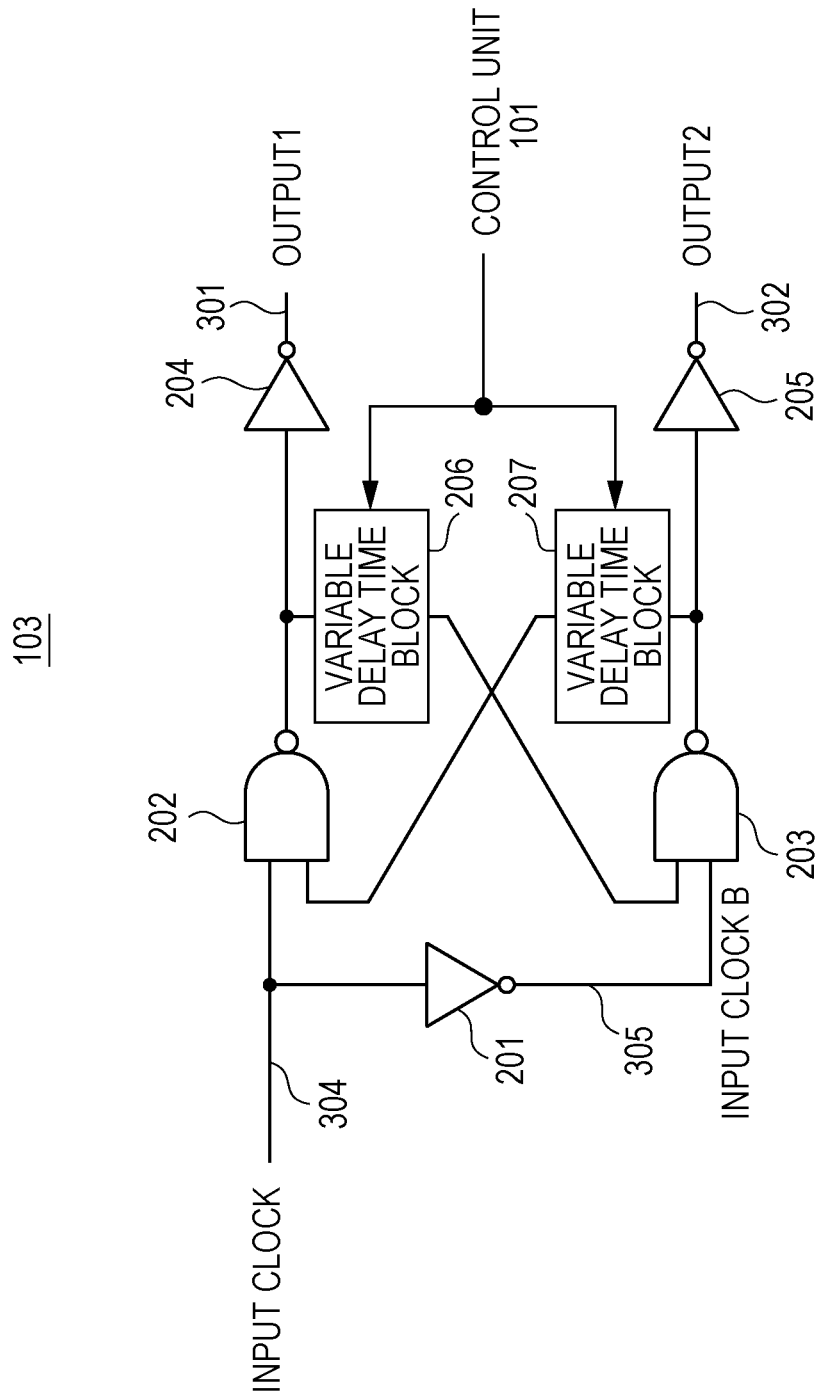
FIG. 5 shows the configuration of a duty ratio converter in the first embodiment of the present disclosure.

The configuration and operation of the duty ratio converter 103 in the first embodiment of the present disclosure will be described in detail with reference to FIGS. 5 and 6.

The duty ratio converter 103 is also called a non-overlap clock generator. A carrier wave signal having a 50% duty ratio input to the duty ratio converter 103 from the phase signal generator 102 is transferred to an input clock 304.

An input clock B 305 is generated in an inverter 201 as the inverted signal of the input clock 304. The input clock 304 and the input clock B 305 are transferred to output1 301 and output2 302 via an NAND 202 and an NAND 203, and an inverter 204 and an inverter 205, respectively. To the input clock 304 and the input clock B 305 transferred to the output1 301 and output2 302, signals inverse to each other are added through a variable delay time block 206 and a variable delay time block 207. This gives the output1 301 and the output2 302 the time waveforms shown in FIG. 6.

The variable delay time block 206 and the variable delay time block 207 output the signal input from either the NAND 202 or the NAND 203 after a delay of a prescribed amount of time in accordance with the control signal input from the control unit 101. The amounts of delay time added in the variable delay time block 206 and the variable delay time block 207 may be the same or different.

Figure 6:
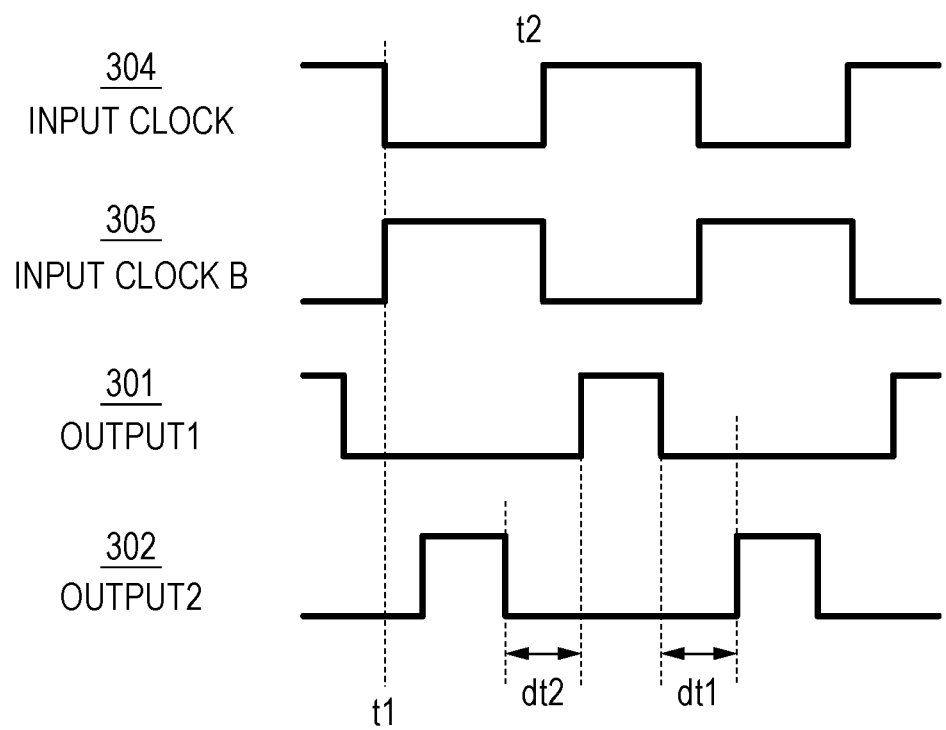
FIG. 6 shows the waveforms of input and output signals to/from the duty ratio converter in the first embodiment of the present disclosure.

The illustration in FIG. 6 assumes that delays in elements other than the delay time dt1 of the variable delay time block 206 and the delay time dt2 of the variable delay time block 207 are small and negligible for the sake of simplicity. In addition, delay time dt1 and delay time dt2 are assumed to be equal (dt1=dt2).

When the input clock 304 becomes low (hereinafter abbreviated as "L") at time t1, the output of the NAND 202 becomes high (hereinafter abbreviated as "H"), resulting in the output1 301 via the inverter 204 becoming L. Since the output of the NAND 202 is H and the input clock B 305 is H, the output2 302 becomes H; however, since it takes the delay time dt1 of the variable delay time block 206 for the output of the NAND 202 to be transferred to the NAND 203, the output2 302 changes to H after the delay time dt1.

When the input clock B 305 subsequently becomes L at time t2, the output of the NAND 203 becomes H and output2 302 becomes L. Also, since the input clock 304 which is one of the inputs to the NAND 202 is H but the output of the variable delay time block 207, which is the other input, reaches the NAND 202 after a delay of dt2, the output1 301 changes to H after a delay of dt2.

In this manner, output1 301 and output2 302 which are signals having the duration of H reduced by the delay times dt1 and dt2 can be derived from the input clock 304 of 50% duty ratio. In other words, signals with a varied duty ratio are produced. Note that change (conversion) of the duty ratio means changing (converting) the ratio of the on-duration to one period while leaving the frequency unchanged.

The minimum value of the duty ratio is 0.35 to 0.4, for example; more specifically, 0.37 for example. This minimizes the ratio of the total power of frequencies of unnecessary high-order harmonics to the signal power of the necessary frequencies, so that the power efficiency can be maximized. The power efficiency could be also improved when the amplification unit 104 is used in constant amplitude output operation, such as frequency shift keying (FSK).

<Configuration and Operation of the Amplification Unit>

Figure 7:
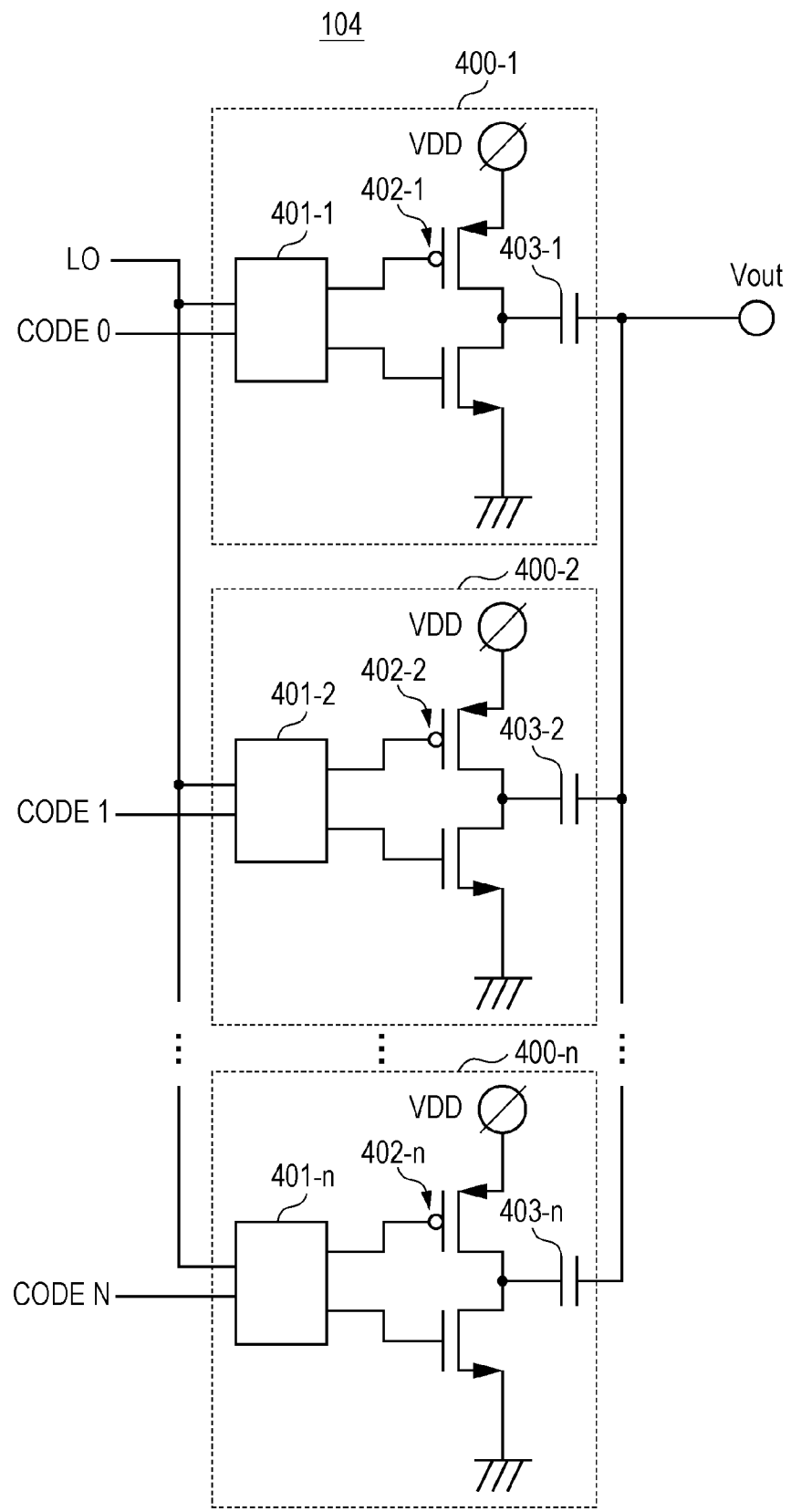
FIG. 7 shows the configuration of an amplification unit in the first embodiment of the present disclosure.

The configuration and operation of the amplification unit 104 in the first embodiment of the present disclosure will be described in detail with reference to FIGS. 7 to 10. The amplification unit 104 shown in FIG. 7 is a switched-capacitor power amplifier. In FIG. 7, codes 0 to N are AM codes, and L0 represents the carrier wave signal input from the duty ratio converter 103.

The amplification unit 104 includes multiple circuits 400-1 to 400-n connected in parallel. The circuits 400-1 to 400-n are composed of carrier wave output units 401-1 to 401-n, class D power amplifiers 402-1 to 402-n that use MOS transistors, and capacitors 403-1 to 403-n connected to the output side of the class D power amplifiers.

To the carrier wave output units 401-1 to 401-n, an AM code (codes 0 to N) for controlling the number of class D power amplifiers in operation and the carrier wave signal L0 are input. Each of the carrier wave output units 401-1 to 401-n outputs the input carrier wave signal L0 when the input AM code has become high level.

Figure 8:
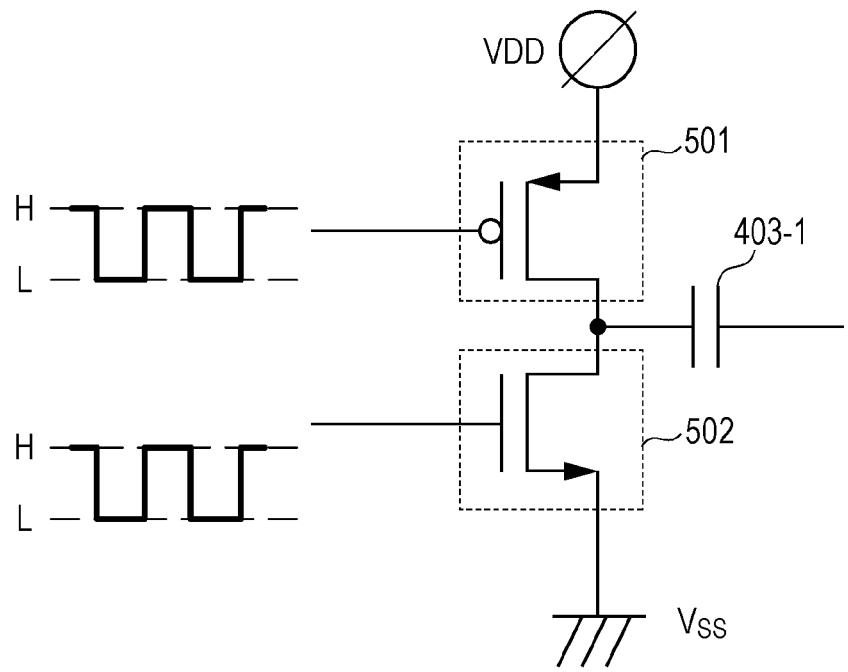
FIG. 8 shows an equivalent circuit of a class D power amplifier when the AM code is high level in the first embodiment of the present disclosure.

FIG. 8 illustrates a mode in which the class D power amplifier 402-1 is activated when the AM code is high level. In this mode, a voltage having a waveform close to a high frequency rectangular wave is input to the gates of a Pch transistor 501 and an Nch transistor 502 constituting the class D power amplifier 402-1, and the class D power amplifier 402-1 performs class D operation for outputting a rectangular wave signal. The class D power amplifier 402-1 has high power efficiency because current flows therein at the moment the transistor switches.

Figure 9:
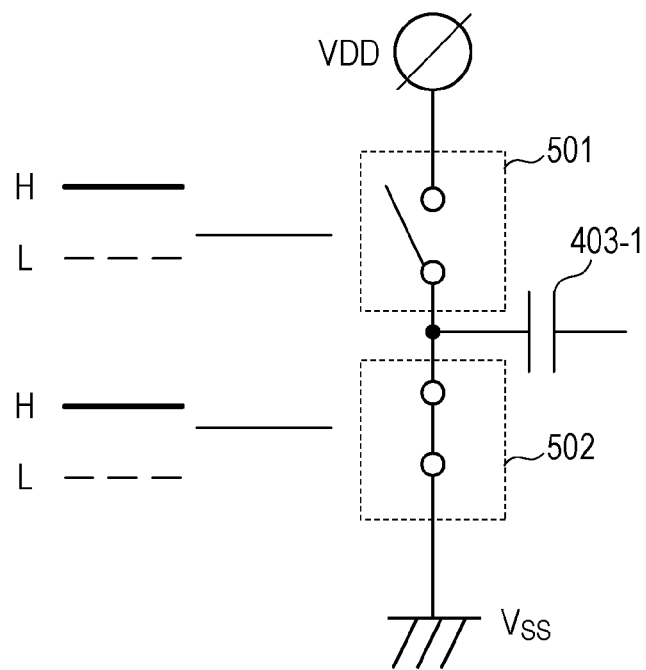
FIG. 9 shows an equivalent circuit of a class D power amplifier when the AM code is low level in the first embodiment of the present disclosure.

FIG. 9 illustrates a mode in which the AM code is low level and the class D power amplifier 402-1 does not operate. In this mode, a signal of high level is input to the gates of the Pch transistor 501 and the Nch transistor 502 so that the Pch transistor 501 turns off and the drain voltage of the Nch transistor 502 is grounded at low level. The capacitor 403-1 connected in series to the output node of the class D power amplifier 402-1 is equivalently connected to the ground plane $V_{SS}$. As the class D power amplifiers 402-2 to 402-n are identical with the class D power amplifier 402-1, their description is omitted.

Figure 10:
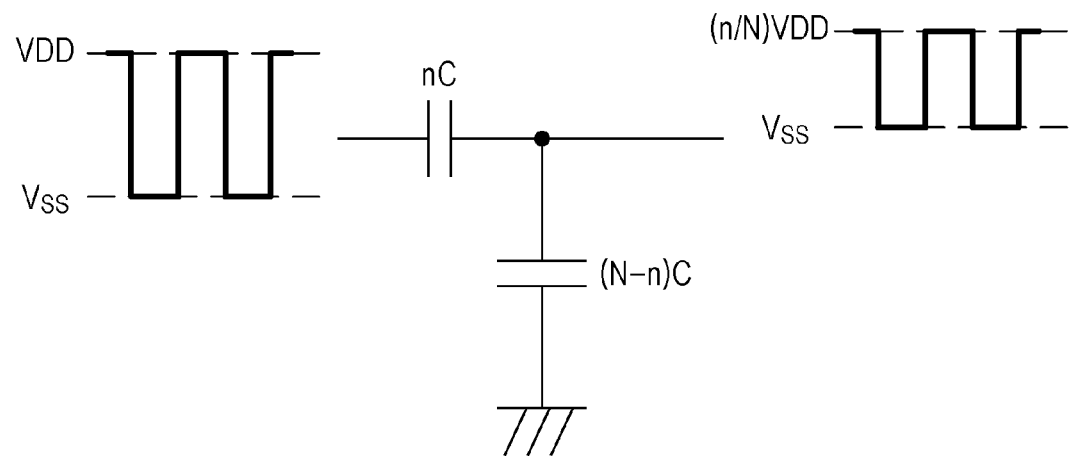
FIG. 10 shows an equivalent circuit of the amplification unit in the first embodiment of the present disclosure.

FIG. 10 shows an equivalent circuit of the entire amplification unit 104, where n represents the number of class D power amplifiers that are in operation, N represents the total number of class D power amplifiers, and C represents the capacitance value of the capacitor belonging to each class D power amplifier.

The voltage waveform of the drain terminal of the Nch transistor 502 shown in FIG. 8 is a square wave that varies from the ground plane $V_{SS}$ to the supply voltage VDD. The output voltage Vout of the amplification unit 104 has a waveform equivalent to the square wave divided in capacitance by the total capacitance (N-n)C of the capacitors connected to the (N-n) non-operating class D power amplifiers relative to the total capacitance nC of the capacitors connected to the n operating class D power amplifiers, as illustrated in FIG. 10. The output voltage Vout of the amplification unit 104 is a square wave with the maximum voltage of (n/N)VDD. The output voltage Vout of the amplification unit 104 is accordingly proportional to the number n of class D power amplifiers that are in operation.

<Operation of the Power Amplification Apparatus>

The operation of the power amplification apparatus in the first embodiment of the present disclosure will be described in detail.

The control unit 101 controls the amplitude by controlling the number of class D power amplifiers in operation with the AM code so as to change the ratio between the number of class D power amplifiers in the operating mode shown in FIG. 8 and the number of class D power amplifiers in the non-operating mode shown in FIG. 9.

The control unit 101 also performs control to change the duty ratio of the carrier wave in accordance with the AM code. In the power amplification apparatus 100, when the number of class D power amplifiers in operation is increased through the AM code, the current increases and a voltage drop due to parasitic resistance in the power supply wiring becomes larger. As a result, the output voltage starts to saturate and hence the linearity decreases.

To mitigate the effect of saturation of the output voltage, the duty radio is increased to make the operation time longer for an AM code at which the output voltage starts to saturate, thereby increasing the output voltage. When the output voltage value is small, in contrast, the duty ratio is decreased to make the operation time shorter as mentioned above, thereby controlling occurrence of an unwanted through current that flows from the Pch transistor to the Nch transistor and preventing a reduction in the power efficiency.

In a case where the output signal is an OFDM signal, reduction of efficiency when outputting a voltage close to the saturation voltage would have little effect on the average power efficiency because output of a voltage close to the saturation voltage is infrequent. In contrast, since a voltage of a small amplitude is frequently output, the average power efficiency can be improved by increasing the power efficiency when outputting a voltage of a small amplitude.

The relationship between the duty ratio and the output voltage Vout is represented by Equation (1), where D is the value of the duty ratio;

$$Vout = \frac{2}{\pi} \frac{n}{N} V_{DD} \sin(\pi D) \quad (1)$$

From Equation (1), the output voltage Vout varies based on change of the duty ratio value D.

Since the Nch transistor and the Pch transistor alternately turn on in the class D power amplifier, the gate voltage of the Nch transistor and the gate voltage of the Pch transistor are controlled by the carrier wave signal. In this process, the waveform of the gate voltages can become rounded (deformed) due to the effect of parasitic elements including parasitic resistance or parasitic capacitance in wiring. For example, when the waveform is rounded (deformed) with a duty ratio of 0.5, the Nch transistor and the Pch transistor could turn on, producing an unwanted through current to cause a reduction in power efficiency. Accordingly, the control unit 101 generates a control signal for decreasing the duty ratio and outputs it to the duty ratio converter 103 in order to prevent the Nch transistor and Pch transistor from turning on due to rounding (deformation) of the waveform.

Figure 2:
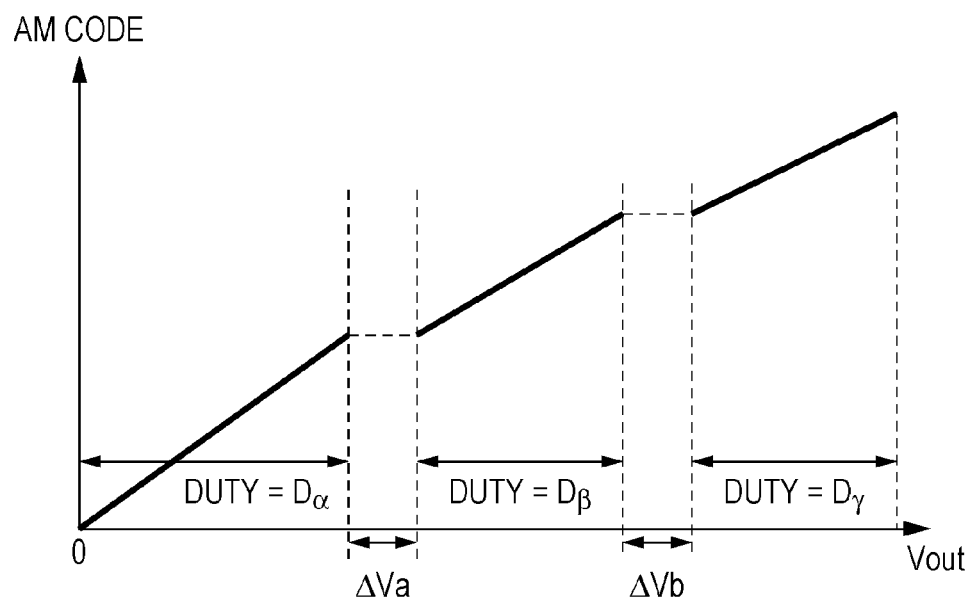
FIG. 2 shows the relationship between the AM code and the output voltage when the duty ratio is varied in a conventional art.

Depending on the amount of change of the duty ratio, the amount of variation in the output voltage, which varies with the duty ratio, can be larger than the amount of variation of the output voltage corresponding to one AM code. More specifically, as shown in FIG. 2, when the amount of change in the duty ratio between the duty ratio value $D_\alpha$ and the duty ratio value $D_\beta$ is large, a variation in the output voltage equivalent to variation in the output voltage corresponding to, for example, several AM codes (ΔVa in FIG. 2) occurs around the change of the duty ratio. This leads to degradation in the AM-AM characteristics, for example, degradation in distortion characteristics of the adjacent channel leakage power ratio.

The control unit 101 thus generates an appropriate AM code for preventing the degradation in AM-AM characteristics and outputs it to the amplification unit 104 at the time of changing the duty ratio.

Control for preventing degradation in AM-AM characteristics will be described in greater detail with reference to FIG. 11.

Figure 1:
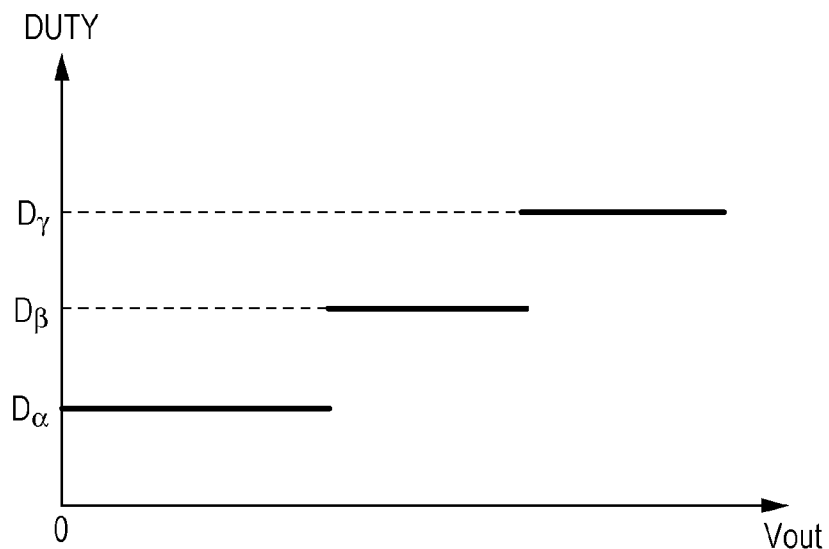
FIG. 1 shows the relationship between the duty ratio and the output voltage used in a power amplification apparatus.

The control unit 101 implements control for varying the duty ratio as three values, $D_\alpha$, $D_\beta$, and $D_\gamma$, for example, as shown in FIG. 1. When setting the duty ratio to $D_\alpha$, the control unit 101 generates the AM code along the straight line L1 of the duty ratio $D_\alpha$ shown in FIG. 11 to control the value of output voltage Vout. When setting the duty ratio to $D_\beta$, the control unit 101 generates the AM code along the straight line L2 of the duty ratio $D_\beta$ shown in FIG. 11 to control the value of output voltage Vout. When setting the duty ratio to $D_\gamma$, the control unit 101 generates the AM code along the straight line L3 of the duty ratio $D_\beta$ shown in FIG. 11 to control the value of output voltage Vout. The control unit 101 carries out the above control by selecting an AM code using the correspondence shown in FIG. 4.

Figure 11:
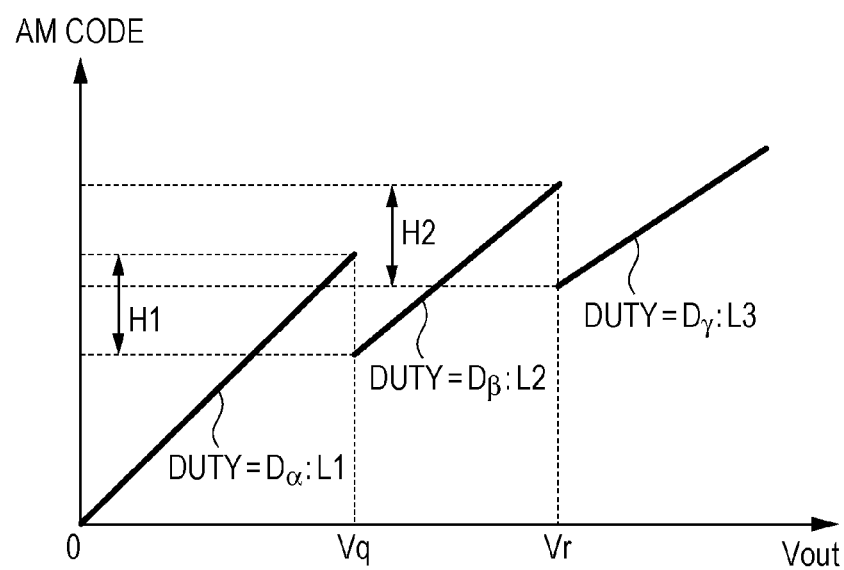
FIG. 11 shows the relationship between the output voltage and the AM code when the duty ratio is changed in the first embodiment of the present disclosure.

When changing the duty ratio from $D_\alpha$ to $D_\beta$, the control unit 101 decreases the AM code by H1, thereby holding the output voltage at Vq both before and after the change of the duty ratio as shown in FIG. 11. The output voltage Vout therefore varies continuously around the change of the duty ratio. This also applies when the duty ratio is changed from $D_\beta$ to $D_\gamma$.

When changing the duty ratio from $D_\gamma$ to $D_\beta$, the control unit 101 increases the AM code by H2, thereby holding the output voltage at Vr both before and after the change of the duty ratio as shown in FIG. 11. The output voltage Vout therefore varies continuously around the change of the duty ratio. This also applies when the duty ratio is changed from $D_\beta$ to $D_\alpha$.

As described above, according to this embodiment, variations in output power can be suppressed when the duty ratio is changed and fine linearity of the output signal can be obtained with power amplifiers alone, so that distortion characteristics of the adjacent channel leakage ratio can be improved, for example. Specifically, according to the first embodiment, occurrence of a voltage that cannot be output is avoided and reduction in the linearity of the power amplifiers is suppressed by controlling the operation status of the class D power amplifiers when the duty ratio of the carrier wave signal being input to the class D power amplifiers is changed.

Additionally, since the first embodiment makes the duty ratio high so as to increase the maximum output voltage at the time of the maximum output, the saturation voltage is prolonged to further improve the linearity of the AM-AM characteristics, allowing output of a large voltage value. The average power efficiency does not decrease in this case as mentioned above. This is equivalent to an increase in the number of AM codes used for controlling the amplitude without increasing the number of power amplifiers, enabling fine control of the output power.

Although the duty ratio was described as being varied as three different values in the above embodiment, this is not a limitation; the duty ratio may be varied as two or four or more different values.

Second Embodiment

As the power amplification apparatus according to a second embodiment of the present disclosure has the same configuration as FIG. 1, its description is omitted. The second embodiment will be described using the reference characters used in FIG. 1.

<Operation of the Power Amplification Apparatus>

The operation of the power amplification apparatus according to the second embodiment of the present disclosure will be described in detail with reference to FIGS. 12 and 13.

Figure 12:
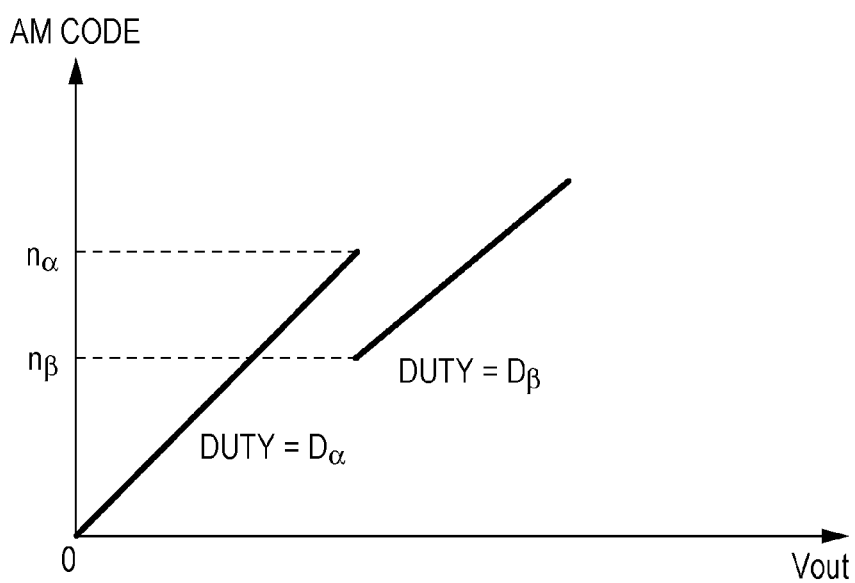
FIG. 12 shows the relationship between the output voltage (the horizontal axis) and the AM code (the vertical axis) when the duty ratio is changed in a second embodiment of the present disclosure.

In the second embodiment of the present disclosure, when the value of the duty ratio shown in FIG. 12 is increased from $D_\alpha$ to $D_\beta$, for example, the largest AM code with the duty ratio value of $D_\alpha$ is represented by $n_\alpha$ and the smallest AM code with the duty ratio value of $D_\beta$ is represented by $n_\beta$. Here, $n_\alpha$ and $n_\beta$ are discrete values. The control unit 101 generates an AM code with $n_\beta$ limited in the range that satisfies Equation (2).

$$n_\beta > n_\alpha \frac{\sin(\pi D_\alpha)}{\sin(\pi D_\beta)}, \; 0 < D_\alpha < D_\beta \le 0.5 \quad (2)$$

Figure 13:
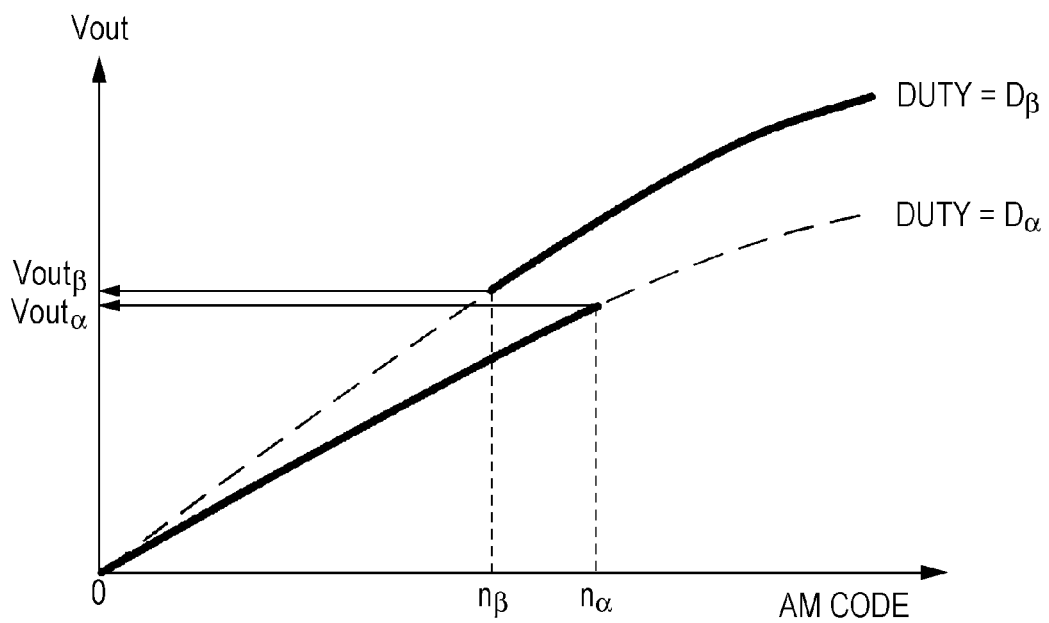
FIG. 13 shows the relationship between the output voltage (the vertical axis) and the AM code (the horizontal axis) when the duty ratio is changed in the second embodiment of the present disclosure.

In this case, as shown in FIG. 13, the output voltage $Vout_\beta$ with the duty ratio value $D_\beta$ and the AM code $n_\beta$ can be made larger than the output voltage $Vout_\beta$ with the duty ratio value $D_\alpha$ and the AM code $n_\alpha$ at the time of switching of the duty ratio by which to change the duty ratio converter control signal and the AM code.

The control unit 101 generates an AM code in a limited range that satisfies an inequality which is a modification of Equation (2) also when decreasing the duty ratio.

As described above, in addition to the effects of the first embodiment, the second embodiment enables control of the AM code without involving a complicated control process, such as observing the output voltage and selecting the AM code, for example, so a transmitter of a simple mechanism can be realized.

In the second embodiment, given the effects of parasitic components, the AM code may be controlled with some margin instead of being controlled to a limit value satisfying Equation (2).

In addition, although the second embodiment sets a limitation on the AM code so that the output voltage is increased at the time of changing the duty ratio value when the duty ratio is increased from $D_\alpha$ to $D_\beta$, a limitation on the AM code may be set such that the output voltage is not decreased when the duty ratio value is changed. Likewise, when the duty ratio is decreased from $D_\beta$ to $D_\alpha$, a limitation on the AM code may be set such that the output voltage is not increased at the time of changing the duty ratio value.

The embodiments of the present disclosure have been described.

In the embodiments described above, the correspondence shown in FIG. 4 may be determined on a per-product basis in an inspection at the time of shipment, uniquely determined, or adaptively updated as needed such as at the time of startup during use or when there is a change in the operating environment, for example.

In one general aspect, a power amplification apparatus according to the present disclosure is a power amplification apparatus comprising: a controller operative to generate, in accordance with an output voltage, a code for controlling a number of class D power amplifiers that are in operation among the plurality of class D power amplifiers; a duty ratio converter operative to change a duty ratio of a carrier wave signal in accordance with the output voltage; and an amplifier including the plurality of class D power amplifiers and operative to output a signal of a prescribed voltage using the class D power amplifiers that are in operation, based on the generated code and the carrier wave signal having the changed duty ratio, wherein: when the duty ratio is increased by the duty ratio converter, the controller generates the code for decreasing the number of class D power amplifiers that are in operation; and when the duty ratio is decreased by the duty ratio converter, the controller generates the code for increasing the number of class D power amplifiers that are in operation.

In another general aspect, the controller may generate no code for decreasing a voltage of the signal when the duty ratio is increased by the duty ratio converter, and may generate no code for increasing the voltage of the signal when the duty ratio is decreased by the duty ratio converter.

In another general aspect, a minimum value of the duty ratio may be 0.37.

In another general aspect, a method according to the present disclosure is a method for controlling a number of class D power amplifiers that are in operation among a plurality of class D power amplifiers, the method comprising: generating, in accordance with an output voltage, a code for controlling the number of class D power amplifiers that are in operation; and changing a duty ratio of a carrier wave signal in accordance with the output voltage, wherein: when the duty ratio is increased, the code for decreasing the number of class D power amplifiers that are in operation is generated; and when the duty ratio is decreased, the code for increasing the number of class D power amplifiers that are in operation is generated.

The power amplification apparatus and control method according to the present disclosure is suited for amplifying a transmission signal using multiple class D power amplifiers.

What is claimed is:

1. A power amplification apparatus, comprising:
    a controller operative to generate a code for controlling a number of class D power amplifiers that are in operation among a plurality of class D power amplifiers, the code being generated in accordance with a voltage setting signal indicating a target voltage to be output from the power amplification apparatus;
    a duty ratio converter operative to change a duty ratio of a carrier wave signal in accordance with the target voltage to be output; and
    an amplifier including the plurality of class D power amplifiers and operative to output a signal of a prescribed voltage using the class D power amplifiers that are in operation, based on the code generated by the controller and the carrier wave signal having the changed duty ratio,
    wherein:
    when the duty ratio is increased by the duty ratio converter, the controller generates the code for decreasing the number of class D power amplifiers that are in operation; and
    when the duty ratio is decreased by the duty ratio converter, the controller generates the code for increasing the number of class D power amplifiers that are in operation.

2. The power amplification apparatus according to claim 1,
wherein the controller generates no code for decreasing the target voltage when the duty ratio is increased by the duty ratio converter, and generates no code for increasing the target voltage when the duty ratio is decreased by the duty ratio converter.

3. The power amplification apparatus according to claim 1,
wherein a minimum value of the duty ratio is 0.37.

4. A method for controlling a number of class D power amplifiers that are in operation among a plurality of class D power amplifiers, the method comprising:
generating a code for controlling the number of class D power amplifiers that are in operation, the code being generated in accordance with a voltage setting signal indicating a target voltage to be output; and
changing a duty ratio of a carrier wave signal in accordance with the target voltage to be output,
wherein:
when the duty ratio is increased, the code for decreasing the number of class D power amplifiers that are in operation is generated; and
when the duty ratio is decreased, the code for increasing the number of class D power amplifiers that are in operation is generated.

* * * * *